US010353163B1

United States Patent
Hanks et al.

(10) Patent No.: US 10,353,163 B1
(45) Date of Patent: Jul. 16, 2019

(54) EQUIPMENT ENCLOSURE WITH SEMI-PERMEABLE BREATHABLE FABRIC SIDES FOR IMPROVED CONVECTIVE HEAT TRANSFER

(71) Applicant: ARRIS Enterprises LLC, Suwanee, GA (US)

(72) Inventors: William Turner Hanks, Carol Stream, IL (US); Jeffrey Joseph Howe, West Chicago, IL (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 16/163,513

(22) Filed: Oct. 17, 2018

(51) Int. Cl.
  *H05K 5/02* (2006.01)
  *G02B 6/44* (2006.01)
  *G02B 6/42* (2006.01)
(52) U.S. Cl.
  CPC ......... *G02B 6/4448* (2013.01); *G02B 6/4246* (2013.01); *G02B 6/4269* (2013.01); *H05K 5/0217* (2013.01)

(58) Field of Classification Search
  CPC ...... G02B 6/42; G02B 6/4201; G02B 6/4246; G02B 6/4269; G02B 6/4448; H04B 10/40; G06F 1/00; G06F 1/16; H05K 5/0217
  USPC ........ 385/14, 88–94, 134–139; 398/140, 141
  See application file for complete search history.

(56) References Cited

U.S. PATENT DOCUMENTS

2018/0299928 A1* 10/2018 Mahoney .............. G06F 1/1656

* cited by examiner

*Primary Examiner* — Michael P Mooney
(74) *Attorney, Agent, or Firm* — Lori Anne D. Swanson

(57) ABSTRACT

A fiber optic node includes an electronics equipment enclosure. The electronics equipment enclosure includes a lid, a base, and at least one side wall defining an interior space of the electronics equipment enclosure. The fiber optic node further includes an optical receiver mounted within the interior space of the electronics equipment enclosure. The at least one side wall is coupled to the lid, the base, or both the lid and the base. The at least one side wall is formed of at least a semi-permeable fabric mesh. The semi-permeable fabric mesh includes a rigid mesh screen and a semi-permeable membrane coupled to the rigid mesh screen for convection of heat generated within the interior space by the optical receiver to outside the electronics equipment enclosure.

20 Claims, 4 Drawing Sheets

EQUIPMENT ENCLOSURE WITH SEMI-PERMEABLE BREATHABLE FABRIC SIDES FOR IMPROVED CONVECTIVE HEAT TRANSFER

TECHNICAL FIELD

The examples described herein, in general, relate to electrical equipment enclosures with enhanced convective heat transfer, for example, a fiber optic node in a hybrid fiber coaxial (HFC) network.

BACKGROUND

An optical fiber network is a means of communication that uses signals encoded onto light to transmit information among various nodes of a telecommunications network. A HFC network is a type of optical fiber network that combines optical fiber and coaxial cable. In an example HFC network, television channels are sent from the headend at the cable provider system's distribution facility to different communities through optical fiber subscriber lines connected to the HFC network.

In the HFC network, fiber optic cables connect the headend to numerous fiber optic nodes (optical nodes). Each fiber optic node may serve about 25 to 2,000 homes. Current generation fiber optic nodes rely primarily on radiative cooling out the bottom of the base (e.g., for amplifiers) and the top of the lid (e.g., for any other electronics). Meanwhile the sides of the fiber optic node are made of aluminum, which does not assist much in cooling the fiber optic node electronics. In addition, the current generation fiber optic nodes are very heavy.

SUMMARY

According to the present disclosure, two types of heat transfer mechanisms (both convection and heat conduction) are utilized to move heat away from the fiber optic node. A lighter material is also utilized to fabricate the fiber optic node to improve installation and facilitate handling.

In a first example, a fiber optic node includes an electronics equipment enclosure. The electronics equipment enclosure includes a lid, a base, and at least one side wall defining an interior space of the electronics equipment enclosure. The fiber optic node further includes an optical receiver mounted within the interior space of the electronics equipment enclosure. The at least one side wall is coupled to the lid, the base, or both the lid and the base. The at least one side wall is formed of at least a semi-permeable fabric mesh. The semi-permeable fabric mesh includes a rigid mesh screen and a semi-permeable membrane coupled to the rigid mesh screen for convection of heat generated within the interior space by the optical receiver to outside the electronics equipment enclosure.

In a second example, an electronics equipment enclosure includes a lid, a base, and at least one side wall defining an interior space of the electronics equipment enclosure. The electronics equipment enclosure further includes one or more circuit boards stored inside the interior space of the electronics equipment enclosure. The at least one side wall is coupled to the lid, the base, or both the lid and the base. The at least one side wall is formed of at least a semi-permeable fabric mesh. The semi-permeable fabric mesh includes a rigid mesh screen and a semi-permeable membrane coupled to the rigid mesh screen for convection of heat generated by the one or more circuit boards within the interior space to outside the electronics equipment enclosure.

In a third example, an electronics equipment enclosure includes a lid having a lid top and lid side walls extending downwards from outer boundaries of the lid top. The electronics equipment enclosure further includes a base having a base bottom and base side walls extending upwards from outer boundaries of the base bottom. The lid and the base are joined together at the lid side walls and the base side walls to define an interior space of the electronics equipment enclosure. The electronics equipment enclosure further includes electronics equipment mounted within the interior space of the electronics equipment enclosure. Each of the lid side walls and the base side walls are formed of at least a semi-permeable fabric mesh. The semi-permeable fabric mesh includes a rigid mesh screen and a semi-permeable membrane coupled to the rigid mesh screen for convection of heat generated within the interior space by the electronics equipment to outside the electronics equipment enclosure.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The figures depict one or more implementations in accordance with the present teachings by way of example only, not by way of limitation. In the figures, like reference numbers refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high level, without detailed comment in order to avoid unnecessarily obscuring aspects of the present teachings.

In some of the example applications described herein, the electronics equipment enclosure relates to a fiber optic node in an HFC network. Communications over the HFC network utilize signals encoded into a light beam to transmit information among various nodes of the HFC network. At the headend, various services are encoded, modulated and up converted onto radio frequency (RF) carriers, combined onto a single electrical signal, and inserted into a broadband optical transmitter at the headend. The broadband optical transmitter converts the electrical signal to a downstream optically modulated signal that is sent over the HFC network. However, it should be understood that the electronics equipment enclosure can be utilized for many different types of applications whereby heat and/or weight are an issue. For example, the electronics equipment enclosure can be utilized for stereos, set-top-boxes, personal computers, cell phones, and many other applications.

The orientations of the fiber optic node, electronics equipment enclosure, associated components and/or any complete devices incorporating the electronics equipment enclosure shown in any of the drawings, are given by way of example only, for illustration and discussion purposes. In operation for a particular application, the electronics equipment enclosure may be oriented in any other direction suitable to the particular application, for example upright or sideways, or any other orientation. For example, if the fiber optic node is hanging sideways, the upwards and downwards orientations of the electronics equipment enclosure are actually side-to-side. Also, to the extent used herein, any directional term, such as lateral, longitudinal, left, right, up, down, upper, lower, top, bottom, and side, are used by way of example only, and are not limiting as to direction or orientation of any component of an electronics equipment enclosure constructed as otherwise described herein.

Figure 1:
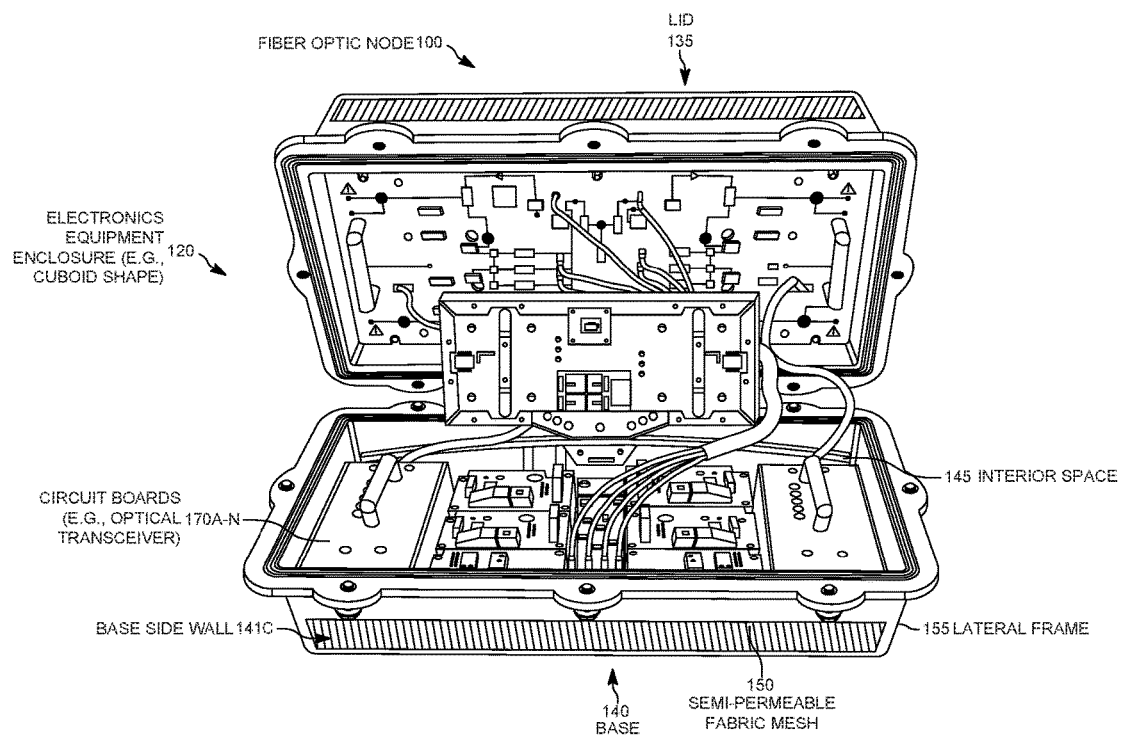
FIG. 1 is an isometric view of a fiber optic node in an open state, which includes an electronics equipment enclosure having an optical transceiver mounted within an interior space and a side wall formed of a semi-permeable fabric mesh.

Shown in the diagram of FIG. 1 is an isometric view of a fiber optic node 100 in an open state. At each local community connected to the HFC network, the fiber optic node 100, is shaped like a box with a lid 135, base 140, and both the base 135 and the lid 140 each include four respective side walls. The lid 135 and the base 140 are removably attached. Each fiber optic node 100 is connected to the main fiber optic transmission cable by a stub fiber optic cable. The fiber optic node 100 has an optical transceiver 170A. Optical transceiver 170A includes an optical receiver that converts the signals received over the stub fiber optic cable from a light beam into electrical signals, and sends the converted electrical signals over coaxial cable lines for distribution to subscriber residences. Optical transceiver 170A also includes a return path optical transmitter that sends communication from the homes back to the headend by converting electrical signals into optical signals.

As shown, fiber optic node 100 includes an electronics equipment enclosure 120 with the optical transceiver 170A disposed inside. The electronics equipment enclosure 120 has a polyhedron, cylinder, cone, sphere, or ellipsoid shape; however, in the example of FIG. 1, the electronics equipment enclosure 120 is a rectangular cuboid polyhedron shape. If the electronics equipment enclosure 120 has a curved shape (e.g., cone, sphere, or ellipsoid shape), for example, then the electronics equipment enclosure 120 has a single side wall 141 with a continuous surface, instead of several intersecting side walls with discontinuous surfaces as shown in FIG. 1. Hence, electronics equipment enclosure 120 generally includes a lid 135, a base 140, and at least one side wall 141. In the example of FIG. 1, the at least one side wall 141 includes four quadrilateral side walls, each of which have four outer edges that define a square, rectangular, or other quadrilateral shape. Although the electronics equipment enclosure 120 is depicted as a clamshell design having the lid 135 and the base 140, the electronics equipment enclosure 120 can be horizontally oriented and cylindrical shaped, for example, in an application to cover an outdoor Bluetooth® speaker.

The at least one side wall 141 is coupled to the lid 135, the base 140, or both the lid 135 and the base 140 when the electronics equipment enclosure 120 is in a closed state and mated together. The at least one side wall 141C defines an interior space 145 of the electronics equipment enclosure 120. Fiber optic node 100 further includes various electrical or electronics equipment, such as various circuit boards 170A-N, mounted within the interior space 145 of the electronics equipment enclosure 120. Circuit boards 170A-N can include various printed circuit boards (PCBs) that mechanically support and electrically connect electronic components or electrical components stored inside the interior space 145 using conductive tracks, pads, and other features etched from one or more sheet layers of copper laminated onto and/or between sheet layers of a non-conductive substrate. Components are generally soldered onto the PCB to both electrically connect and mechanically fasten them to the PCB.

In FIG. 1, one of the circuit boards 170A-N includes the optical transceiver 170A. The at least one side wall 141 is formed of at least a semi-permeable fabric mesh 150. As shown, the at least one side wall 141C includes a lateral frame 155 surrounding a perimeter of the semi-permeable fabric mesh 150. The lateral frame 155, the lid 135, and the base 140 are each formed of a highly conductive material. The highly conductive material forming the lateral frame 155, the lid 135, and the base 140 may include aluminum, copper, other suitable metal, or a combination thereof, as described in further detail below. Lateral frame 155 can include a heat sink including one or more fins like that shown on the lid top 137 of FIG. 2. Heat sink is a passive heat exchanger that dissipates or transfers excessive or unwanted heat (thermal energy) by thermal conduction to air outside the electronics equipment enclosure 120.

Figure 3:
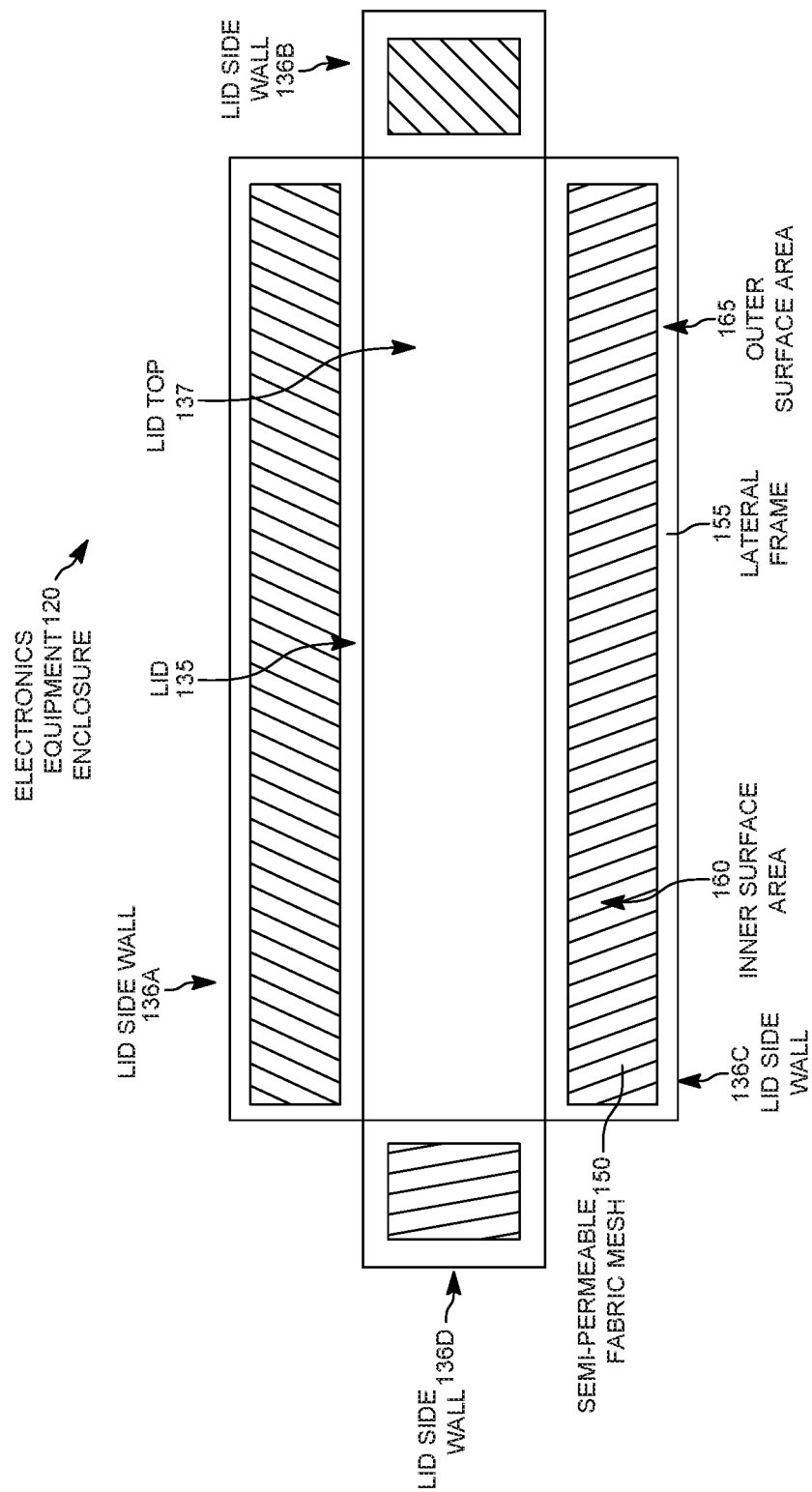
FIG. 3 is a flattened view of a lid of the electronics equipment enclosure of the fiber optic node of FIG. 1.
Figure 4:
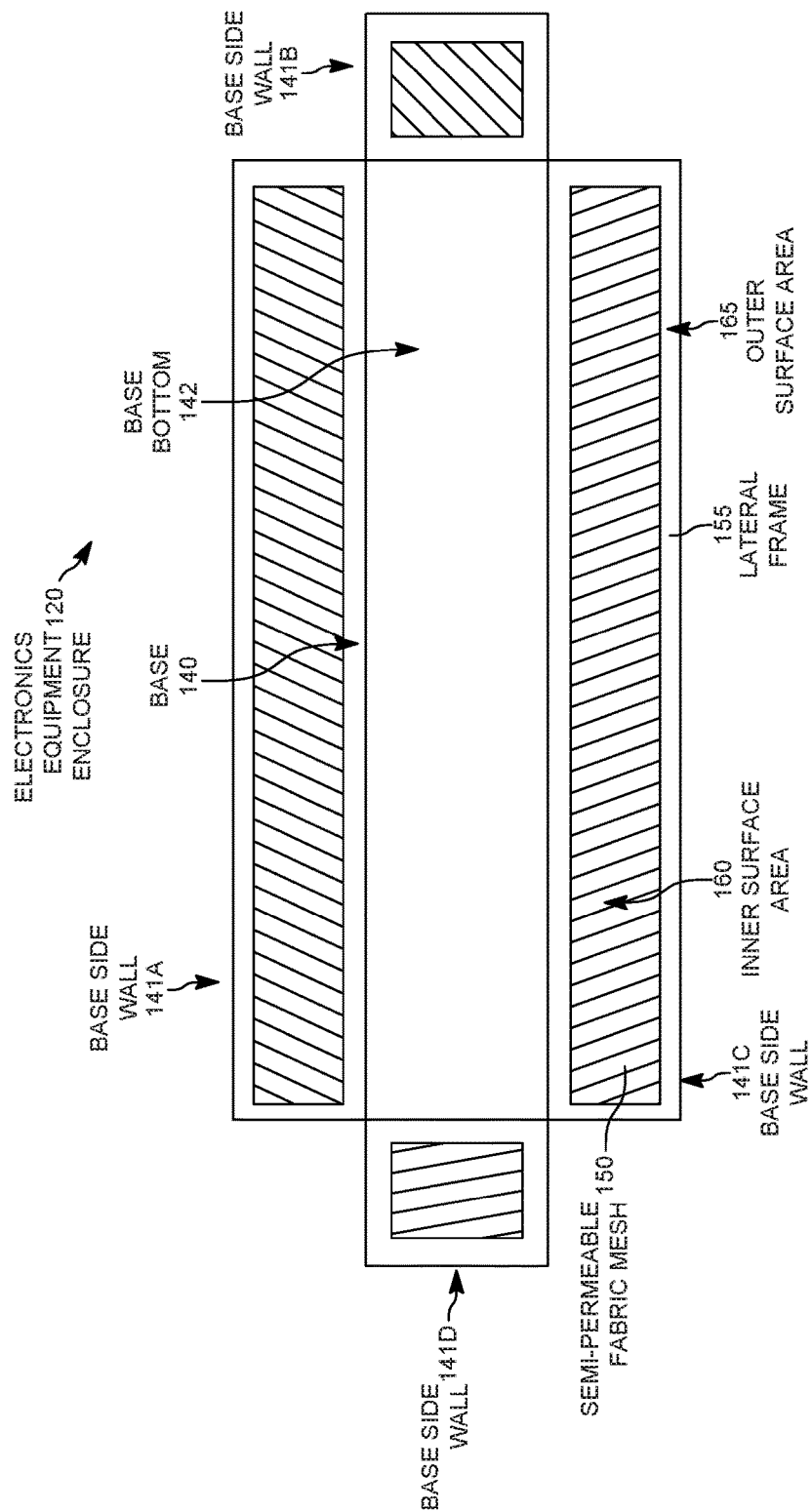
FIG. 4 is a flattened view of a base of the electronics equipment enclosure of the fiber optic node of FIG. 1.

Lateral frame 155 of the electronics equipment enclosure 120 includes metal (e.g., aluminum) corners (e.g., think "tent poles") to support the top and bottom metal (e.g., aluminum) sides (e.g., lid 135 and base 140) of the fiber optic node 100 with relation to the lid 135 and base 140 mating surfaces. However, the sides of the electronics equipment enclosure 120 between the "tent poles" are a durable and breathable waterproof semi-permeable fabric mesh 150, which is a semi-permeable membrane backed by a rigid mesh screen of strong, but heat conductive metal (e.g. copper or other suitable metals). As shown in FIG. 3, if the rigid mesh screen of the semi-permeable fabric mesh 150 is located on the lid side walls 136A-D, then the rigid mesh screen is thermally connected to the lid top 137 to provide structural strength while still allowing heated air to escape. As shown in FIG. 4, if the rigid mesh screen of the semi-permeable fabric mesh 150 is located on the base side walls 141A-D, then the rigid mesh screen is thermally connected to the base bottom 142 to provide structural strength while still allowing heated air to escape. This solution allows the radiative cooling of the electronics as in use in today's generation of fiber optic node 100, but also conducts some of the heat thru the heat-conductive metal (similar to a heatpipe) to the breathable waterproof semi-permeable membrane where convective air currents can help to carry the heat away.

As noted, semi-permeable fabric mesh 150 includes a rigid mesh screen and a semi-permeable membrane coupled to the rigid mesh screen for convection of heat generated by the electrical or electronics equipment within the interior space, such as circuit boards 170A-N (including the optical receiver 170A), to outside the electronics equipment enclosure 120. Semi-permeable membrane is a synthetic membrane, which allows certain molecules to pass through by diffusion. Passage and the rate of passage through the semi-permeable membrane depends on the pressure, concentration, size, and temperature of the molecules inside the interior space 145 of the electronics equipment enclosure 120 as well as the outside. Permeability and rate of passage of molecules through the semi-permeable membrane can vary.

In the examples herein, convection is the heat transfer due to bulk movement of molecules within gases (e.g., air) and occurs through advection, diffusion, or both. Convection cannot take place in solids because neither bulk current flows nor significant diffusion of matter can take place. Diffusion of heat takes place in rigid solids, but that is called heat conduction. Convection, however, can take place in soft solids or mixtures where solid particles can move past each other.

In one example, the semi-permeable membrane is backed by a rigid mesh screen formed of copper. Semi-permeable membrane can be an extremely thin layer of expanded polytetrafluoroethylene (ePTFE) or polyurethane. The semi-permeable membrane may include 9 billion pores (very small holes or openings) per square inch and is about 0.01 millimeters thick. Hence, the semi-permeable membrane is waterproof, but allows convection of hot air from inside the interior space 145 to outside the electronics equipment enclosure 120. The size of the pores of the semi-permeable membrane can vary and the pores can be uniform in size or non-uniform.

For example, semi-permeable membrane is a molecular sieve formed of a material with pores of uniform size. The pore diameter size of the pores are similar in size to smaller molecules, and thus large molecules (e.g., water) cannot enter or be absorbed, while smaller molecules (e.g., gases, such as air or water vapor) can pass through the molecular sieve. Typically, the diameter of the pores of the molecular sieve is measured in angstroms or nanometers. The semi-permeable membrane can be microporous, mesoprous, or macropruous. Microporous material has pore diameters of less than 2 nm (20 Å), macroporous material has pore diameters of greater than 50 nm (500 Å), and mesoporous material lies in the middle with pore diameters between 2 and 50 nm (20-500 Å).

The rigid mesh screen is formed of a highly conductive rigid material, for example, arranged as a matrix comprising intersecting rows and columns of parallel and perpendicular metal wires. The metal wires are interlaced to form a rigid structure, such that the network of wires is not bent or forced out of shape. The metal wires include a cross-sectional area on the order of 1-20 circular millimeters, and the spacing between the wires varies. The larger the cross-sectional area of the metal wires the larger the spacing gaps between the metal wires. Metal wires with a relatively smaller cross-sectional area need to compensate for relatively weak structural integrity and will need smaller spacing gaps between the metal wires.

Semi-permeable membrane is bonded (e.g., adhered, stitched, taped, glued, etc.) to the rigid mesh screen to form the semi-permeable fabric mesh 150, for example, as a laminate. The highly conductive rigid material forming the rigid mesh screen includes copper, aluminum, steel, or other suitable metal. In one example, the rigid mesh screen includes an inner rigid mesh screen portion an outer rigid mesh screen portion. The semi-permeable membrane is sandwiched between the inner rigid mesh screen portion and the outer rigid mesh screen portion.

Highly conductive materials can include metals, electrolytes, superconductors, semiconductors, plasmas and some nonmetallic conductors, such as graphite and conductive polymers. Copper has a high conductivity. Annealed copper is the international standard to which all other electrical conductors are compared. The International Annealed Copper Standard (IACS) conductivity is 58 MS/m, although ultra-pure copper can slightly exceed 101% IACS. Silver is 6% more conductive than copper, but due to cost it is not practical in most cases. Aluminum is 61% of the conductivity of copper by cross-sectional area, but its lower density makes it twice as conductive by mass. Because aluminum is roughly one-third the cost of copper by weight, the economic advantages are considerable when large conductors are required.

Figure 2:
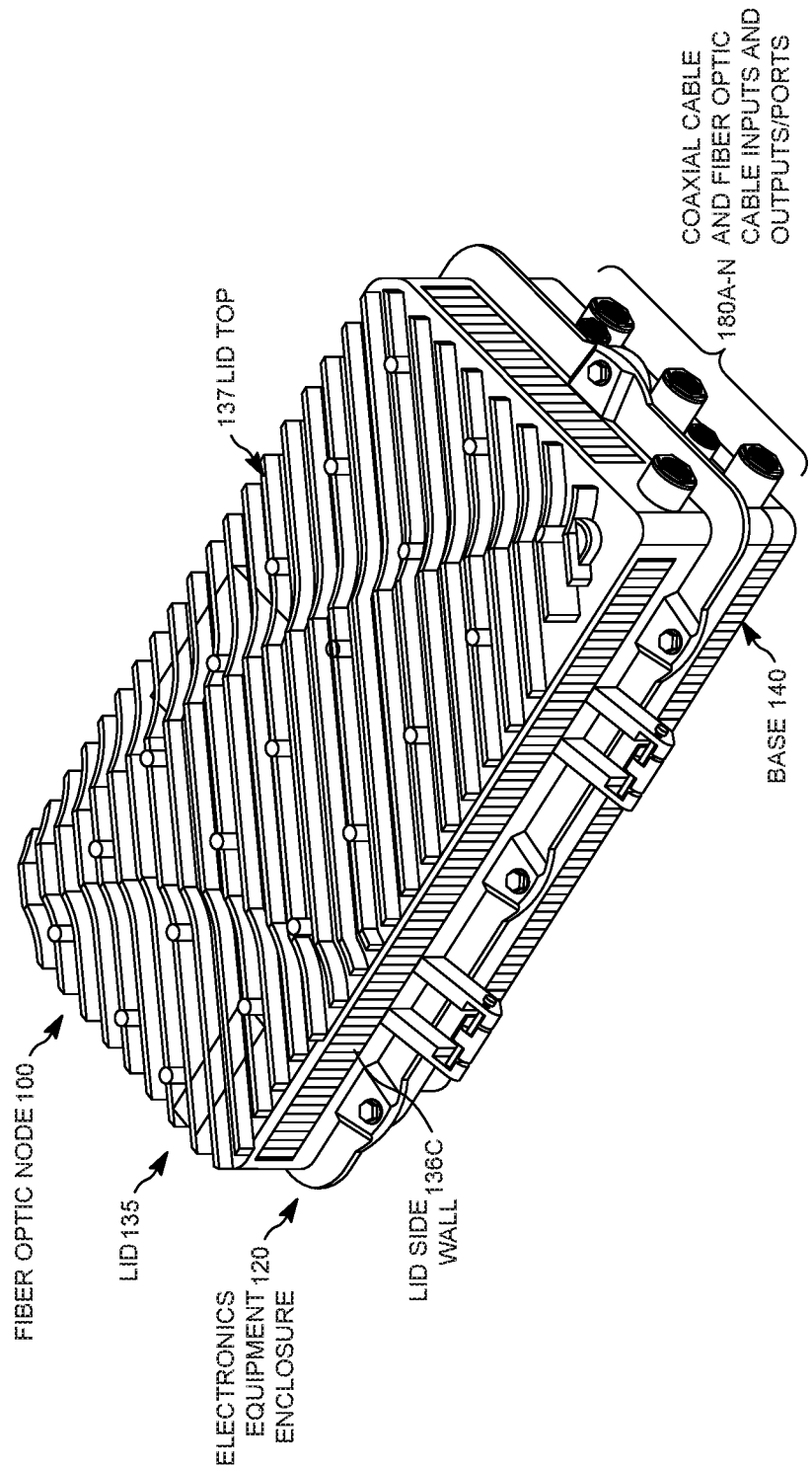
FIG. 2 is another isometric view of the fiber optic node of FIG. 1 in a closed state, which includes the electronics equipment enclosure.

FIG. 2 is another isometric view of the fiber optic node 100 of FIG. 1, which includes the electronics equipment enclosure 120. As shown, the electronics equipment enclosure 120 has a cuboid shape, which can be a square cuboid, rectangular cuboid, etc. The optical transceiver 170A of the mounted circuit boards 170A-N includes an optical transmitter mounted within the interior space 145 of the electronics equipment enclosure 120 to convert electrical signals conveyed via a coaxial cable into optical signals for upstream transmission via a fiber optic cable. The optical transceiver 170A of the mounted circuit boards 170A-N further includes an optical receiver mounted within the interior space of the electronics equipment enclosure to convert optical signals conveyed via the fiber optic cable into electrical signals for downstream transmission via the coaxial cable. As shown in FIG. 2, for such purposes, the fiber optic node 100 includes various coaxial cable and fiber optic cable inputs and outputs/ports 180A-N.

As used herein, coaxial cable is used as a transmission line for radio frequency signals. A fiber optic cable, is an assembly similar to an electrical cable, but containing one or more optical fibers that are used to carry light. The optical fiber elements are typically individually coated with plastic layers and contained in a protective tube suitable for the environment where the cable will be deployed. Downstream is a path from a headend, a hub, down the fiber link to the fiber optic node 100 and further down the coaxial cable, amplifiers, and taps to the customer premise equipment (e.g., cable modems, set-top boxes). Upstream is the path in the opposite direction: from the customer premise equipment, up the coaxial cable, through taps, and upstream amplifiers to the fiber optic node 100, up the optical fiber, the hub, and to the headend.

FIG. 3 is a flattened (i.e., unfolded) view of a lid 135 of the electronics equipment enclosure of the fiber optic node 100 of FIG. 1. In the example, lid 135 can have a lid top 137 and lid side walls 136A-D extending downwards from outer side edges or boundaries of the lid top 137. Lid top 137 and lid side walls 136A-D can be integrally connected to form the lid 135 as one piece, for example. FIG. 4 is a flattened (i.e., unfolded) view of a base 140 of the electronics equipment enclosure 120 of the fiber optic node 100 of FIG. 1. In the example, base 140 can have a base bottom 142 and base side walls 141A-D extending upwards from outer side edges or boundaries of the base bottom 142. Base 140 and base side walls 141A-D can be integrally connected to form the base 140 as one piece, for example. The lid 135 and the base 140 can be removably connected (e.g., joined together or mated) at the lid side walls 136A-D and the base side walls 141A-D to define an interior space 145 of the electronics equipment enclosure 120.

Each of the lid side walls 136A-D and the base side walls 141A-D are formed of at least a semi-permeable fabric mesh 150. Semi-permeable fabric mesh 150 includes a rigid mesh screen and a semi-permeable membrane coupled to the rigid mesh screen for convection of heat generated by the optical transceiver 170A of the circuit boards 170A-N within the interior space 145 to outside the electronics equipment enclosure 120. Rigid mesh screen is thermally connected to either the lid top 137 or base bottom 142 to provide structural strength while still allowing heated air to escape from inside to outside the electronics equipment enclosure 120 via convection. Although shown as being discontinuous in the case where the shape of the electronics equipment enclosure 120 of the fiber optic node 100 is a polyhedron, the lid side walls 136A-D and the base side walls 141A-D may be a continuous surface (e.g., curved surface). The continuous surface or wall may be an ellipsoid, spheroid, cone, paraboloid, or hyperboloid that may be truncated at one or both ends. For example, if the lid 135 and the base 140 have a circular perimeter, then the lid side wall 131A and the base side walls 141A form one combined side wall with a continuous contoured surface.

Alternatively or additionally, the if the outer edges of the lid 135 and the base 140 form a polygon perimeter shape with less than four sides (e.g., triangle), then there are only three lid side walls 136A-C and three base side walls 141A-C. Alternatively or additionally, if the outer edges of the lid 135 and the base 140 form a polygon perimeter shape with greater than four sides (e.g., octagon) then there are eight lid side walls 136A-H and eight base side walls 141A-H. In yet another example, only the lid 135 includes lid side walls 136A-D and the base 140 merely includes a base bottom 142, but does not base side walls 141A-D. Base bottom 142 is removably attached to the lid 135, and thus can be opened to insert the circuit boards 170A-N, including the optical transceiver 170A, within the interior space 145. In another example, only base 140 includes base side walls 141A-D and the lid 135 merely includes lid top 137, but does not include lid side walls 136A-D. Lid top 137 is removably attached to the base 140, and thus can be opened to insert the circuit boards 170A-N, including the optical transceiver 170A, within the interior space 145.

As shown in FIGS. 3-4, in one example, the semi-permeable fabric mesh 150 can be discontinuous and can be divided into four semi-permeable fabric mesh portions spread across each of the four quadrilateral lid side walls 136A-D of the lid 135 and the four quadrilateral base side walls 141A-D of the base 140. In another example, if there are rigid corner posts on the lid 135 then a single strip of semi-permeable fabric mesh can continuously stretch around all four of the posts to make the ends of the strip meet at a seam. Each of the lid side walls 136A-D can include a semi-permeable fabric mesh portion, and each of the four semi-permeable fabric mesh portions can occupy an inner surface area 160 of a respective one of the four lid side walls 136A-D. Additionally, each of the base side walls 141A-D can include a semi-permeable fabric mesh portion, and each of the four semi-permeable fabric mesh portions can occupy an inner surface area 160 of a respective one of the four base side walls 141A-D. In some examples, lid side walls 136A-D or base side walls 141A-D can include multiple rigid sections, which may or may not interrupt the semi-permeable fabric mesh portions.

As further shown, each quadrilateral lid side wall 136A-D and base side wall 141A-D includes a lateral frame 155. Lateral frame 155 occupies an outer surface area 165 of the quadrilateral lid side walls 136A-D and base side walls 141A-D to fill in gaps between the four semi-permeable fabric mesh portions. Lateral frame 155 supports the lid side walls 136A-D of the lid 135 and the base side walls 141A-D of the base 140 with relation to the lid 135 and base 150 mating surfaces. The lid mating surface of the lid 135 contacts and overlaps the base mating surface of the base 140 to close the electronics equipment enclosure 120. Both the lid mating surface and the base mating surface are quadrilateral ringed shaped surfaces with rounded corners.

Lateral frame 155 provides structural integrity around the semi-permeable fabric mesh 150 to prevent deformation of the semi-permeable fabric mesh 150 under the weight of the lid 135 and the base 140, for example, when the lid 135 and the base 140 are mated together in a closed position. Structural integrity is also provided by the lateral frame 155 under routine handling by a service technician and after being deployed in the outside environment of the HFC network. For example, each of the lid side walls 136A-D includes a lateral frame 155, and the lateral frame 155 occupies an outer surface area 165 of the lid side wall 136A-D to fill in the gaps between the four semi-permeable fabric mesh portions. Additionally, each of the base side walls 141A-D includes a lateral frame 155, and the lateral frame 155 occupies and outer surface area 165 of the base side wall 141A-D to fill in the gaps between the four semi-permeable fabric mesh portions. The inner surface area 160 is greater than the outer surface area 165. Because the lid side walls 136A-D and the base side walls 141A-D contain large swathes of area which are no longer exclusively metal, particularly the inner surface area 160, an accompanying reduction in weight occurs. Hence, the semi-permeable fabric mesh 150 reduces weight of the electronics equipment enclosure 120 of the fiber optic node 100.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it may be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A fiber optic node comprising:
    an electronics equipment enclosure including a lid, a base, and at least one side wall defining an interior space of the electronics equipment enclosure; and
    an optical transceiver mounted within the interior space of the electronics equipment enclosure;
    wherein:
        the at least one side wall is coupled to the lid, the base, or both the lid and the base;
        the at least one side wall is formed of at least a semi-permeable fabric mesh; and
        the semi-permeable fabric mesh includes a rigid mesh screen and a semi-permeable membrane coupled to the rigid mesh screen for convection of heat generated by the optical transceiver within the interior space to outside the electronics equipment enclosure.

2. The fiber optic node of claim 1, wherein:
    the rigid mesh screen is formed of a highly conductive rigid material; and
    the semi-permeable membrane is bonded to the rigid mesh screen.

3. The fiber optic node of claim 2, wherein the highly conductive rigid material forming the rigid mesh screen includes copper, aluminum, or steel.

4. The fiber optic node of claim 1, wherein:
    the rigid mesh screen includes an inner rigid mesh screen portion an outer rigid mesh screen portion; and
    the semi-permeable membrane is sandwiched between the inner rigid mesh screen portion and the outer rigid mesh screen portion.

5. The fiber optic node of claim 1, wherein the semi-permeable membrane is microporous.

6. The fiber optic node of claim 1, wherein the semi-permeable membrane is a molecular sieve.

7. The fiber optic node of claim 1, wherein:
    the at least one side wall includes a lateral frame surrounding a perimeter of the semi-permeable fabric mesh; and
    the lateral frame, the lid, and the base are each formed of a highly conductive material.

8. The fiber optic node of claim 7, wherein:
    the electronics equipment enclosure has a cuboid shape; and
    the at least one side wall includes four quadrilateral side walls.

9. The fiber optic node of claim 8, wherein:
    the semi-permeable fabric mesh is discontinuous and is divided into four semi-permeable fabric mesh portions spread across each of the four quadrilateral side walls; and
    each of the four semi-permeable fabric mesh portions occupy an inner surface area of a respective one of the four quadrilateral side walls.

10. The fiber optic node of claim 7, wherein:
    each quadrilateral side wall includes a lateral frame; and
    the lateral frame occupies an outer surface area of the quadrilateral side wall to fill in gaps between the four semi-permeable fabric mesh portions.

11. The fiber optic node of claim 10, wherein the inner surface area is greater than the outer surface area.

12. The fiber optic node of claim 7, wherein:
    the lateral frame includes a heat sink including one or more fins; and
    the highly conductive material forming the lateral frame, the lid, and the base includes aluminum or copper.

13. The fiber optic node of claim 1, wherein the electronics equipment enclosure has a polyhedron, cylinder, cone, sphere, or ellipsoid shape.

14. The fiber optic node of claim 1, when the optical transceiver includes:
    an optical transmitter mounted within the interior space of the electronics equipment enclosure to convert electrical signals conveyed via a coaxial cable into optical signals for upstream transmission via a fiber optic cable; and
    an optical receiver mounted within the interior space of the electronics equipment enclosure to convert optical signals conveyed via the fiber optic cable into electrical signals for downstream transmission via the coaxial cable.

15. An electronics equipment enclosure comprising:
    a lid, a base, and at least one side wall defining an interior space of the electronics equipment enclosure; and
    one or more circuit boards stored inside the interior space of the electronics equipment enclosure;
    wherein:
        the at least one side wall is coupled to the lid, the base, or both the lid and the base;
        the at least one side wall is formed of at least a semi-permeable fabric mesh; and
        the semi-permeable fabric mesh includes a rigid mesh screen and a semi-permeable membrane coupled to the rigid mesh screen for convection of heat generated by the one or more circuit boards within the interior space to outside the electronics equipment enclosure.

16. The electronics equipment enclosure of claim 15, wherein:
the rigid mesh screen is formed of a highly conductive rigid material; and
the semi-permeable membrane is bonded to the rigid mesh screen.

17. The electronics equipment enclosure of claim 16, wherein the highly conductive rigid material forming the rigid mesh screen includes copper, aluminum, or steel.

18. The electronics equipment enclosure of claim 15, wherein:
the rigid mesh screen includes an inner rigid mesh screen portion an outer rigid mesh screen portion; and
the semi-permeable membrane is sandwiched between the inner rigid mesh screen portion and the outer rigid mesh screen portion.

19. The electronics equipment enclosure of claim 15, wherein the semi-permeable membrane is microporous.

20. A fiber optic node comprising:
an electronics equipment enclosure including:
    a lid having a lid top and lid side walls extending downwards from outer boundaries of the lid top; and
    a base having a base bottom and base side walls extending upwards from outer boundaries of the base bottom;
    wherein the lid and the base are joined together at the lid side walls and the base side walls to define an interior space of the electronics equipment enclosure; and
electronics equipment mounted within the interior space of the electronics equipment enclosure;
wherein:
    each of the lid side walls and the base side walls are formed of at least a semi-permeable fabric mesh; and
    the semi-permeable fabric mesh includes a rigid mesh screen and a semi-permeable membrane coupled to the rigid mesh screen for convection of heat generated by the electronics equipment within the interior space to outside the electronics equipment enclosure.

* * * * *